United States Patent
Ojha et al.

(10) Patent No.: US 11,716,072 B1
(45) Date of Patent: Aug. 1, 2023

(54) TIME MULTIPLEXING VOLTAGE CLAMPING IN COIL DRIVING CIRCUIT FOR A CONTACTOR DURING QUICK TURN OFF

(71) Applicant: TEXAS INSTRUMENTS INCORPORATED, Dallas, TX (US)

(72) Inventors: Ashish Ojha, Bangalore (IN); Priyank Anand, Bangalore (IN); Anand Gopalan, Plano, TX (US); Krishnamurthy Shankar, Bangalore (IN)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 17/682,619

(22) Filed: Feb. 28, 2022

(51) Int. Cl.
   *H03K 3/00* (2006.01)
   *H03K 3/011* (2006.01)
   *H03K 17/687* (2006.01)

(52) U.S. Cl.
   CPC ......... *H03K 3/011* (2013.01); *H03K 17/6874* (2013.01); *H03K 2217/0063* (2013.01); *H03K 2217/0072* (2013.01)

(58) Field of Classification Search
   CPC .............. H03K 3/011; H03K 17/6874; H03K 2217/0063; H03K 2217/0072
   USPC ........................................................ 327/109
   See application file for complete search history.

(56) References Cited

U.S. PATENT DOCUMENTS

| | | | | |
|---|---|---|---|---|
| 8,749,279 B2* | 6/2014 | Morita | ................. | H03K 17/063 327/109 |
| 8,816,666 B2* | 8/2014 | Kimura | ................ | H03K 17/691 307/140 |
| 8,884,660 B2* | 11/2014 | Fukuta | ............... | H03K 17/0828 327/109 |
| 9,685,945 B2* | 6/2017 | Osanai | ................. | H03K 17/162 |
| 10,491,095 B2* | 11/2019 | Chen | ....................... | B60L 1/003 |
| 10,578,664 B2* | 3/2020 | Mori | ................... | H03K 17/0828 |
| 11,218,143 B2* | 1/2022 | Dewa | ................... | H03K 17/162 |
| 2012/0206169 A1* | 8/2012 | Kimura | ............ | H03K 17/08122 327/109 |
| 2015/0381148 A1* | 12/2015 | Zeng | ................. | H03K 17/08122 327/109 |

* cited by examiner

*Primary Examiner* — Ryan Jager
(74) *Attorney, Agent, or Firm* — Valerie M. Davis; Frank D. Cimino (57) ABSTRACT

Examples of contactor controllers, systems and methods time-modulate levels of high-side (HS) and low-side (LS) clamp voltages in a contactor controller to switch a path through which current flows during quick-turn-off (QTO) of the contactor controller. One of the clamp voltages is at a high level and the other is at a low level. The output voltage of the contactor controller is held at the low level. The path switching may be a function of one or more parameters. In a configuration, the level of a supply voltage of the contactor controller is monitored and used to control the path switching. In a configuration, temperatures of HS and LS transistors of the contactor controller are monitored and used to control the path switching. Control of the path switching may be performed to dissipate power in a larger area to increase thermal performance of the contactor controller. Both clamps may remain active throughout the QTO process, providing redundancy and safety.

21 Claims, 7 Drawing Sheets

TIME MULTIPLEXING VOLTAGE CLAMPING IN COIL DRIVING CIRCUIT FOR A CONTACTOR DURING QUICK TURN OFF

FIELD OF DISCLOSURE

This disclosure relates to time multiplexing clamp voltages of multiple clamps of a coil driving circuit for a contactor during quick-turn-off (QTO) to switch the load current path, as well as to structures that provide added safety to the QTO process and also enable dissipation of power in a larger area on the chip on which the driving circuitry is located during QTO to increase overall thermal performance of the driving circuitry and contactor.

BACKGROUND

High-voltage contactor systems are widely used in electric vehicles (EVs) and hybrid electric vehicles (HEVs) to control voltage supply to various components. There are different types of contactor systems for different functions in a vehicle but they are similar in some respects.

Generally, a high-voltage contactor system is an electromechanical switching device controller with an associated contactor including a coil to generate a magnetic force to mechanically operate an electric contact (or armature). An appropriate amount of current is applied to the coil to ensure proper force to actuate the contact for robust operation. As an important safety feature in EVs and HEVs, a high-voltage contactor system should be resistant to high voltage load, shock, strong arc extinguishing, and breaking capacity. Such contactor system should also be able to smoothly and safely execute quick-turn-off (QTO), e.g., execute a high rate of current decay. QTO is needed because slow rate current decay may cause chattering of the contactor system (or elements thereof), which, in turn, may cause sparks and/or electrical discharges. Due to this, the contactor may rupture or burn.

In a contactor system with single wire control of the inductive load, one end of the load is connected to the contactor controller's high-side (HS) and low-side (LS) switches, each of which is typically implemented as a field-effect transistor (FET) and controlled by a corresponding driver, and the other (output) end is connected directly to the voltage supply. To regulate the current in the load the LS FET and HS FET can be cyclically turned ON to provide a driving phase and a slow decay phase. Because of the body diode current path in the HS FET, fast decay of the load current is not possible.

To carry out fast decay, the effect of a parasitic diode of the HS FET is blocked by incorporating a QFET and associated driver between the HS and LS components and coupling the output end of the load wire between the QFET and LS FET. With this configuration, if the QFET is turned OFF when load current is present, the output node will very rapidly increase to above the supply voltage, as the load current causes reverse voltage to increase across the inductor. This causes QTO, i.e., fast decay of the load current. A clamping circuit is used during QTO to control/limit the voltage at the output node within the contactor controller ratings.

Thus, an HS clamp is coupled between the gate and drain of the QFET, and a LS clamp is coupled between the gate and drain of the LS FET, where the drains of the two transistors are commonly coupled. When the voltage at the output node is exceeds the supply voltage by the reverse voltage across the inductor, the clamping circuit (HS and LS clamps) enables a path for the load current to flow either through an HS FET path to the supply voltage node or through a LS FET path to ground. More power is generated during QTO when the load current flows through the LS path than when the load current flows through the HS path. As a result, usually only the HS clamp path is used.

In this context, features and aspects of the present disclosure arise.

SUMMARY

In an example, a method, comprises time-modulating levels of first and second clamp voltages in an electromechanical switching device controller to switch a path through which current flows during turn-off of the electromechanical switching device controller. The path switching is a function of at least one of a level of a supply voltage of the electromechanical switching device controller, and temperatures of a high-side (HS) transistor and a low-side (LS) transistor of the electromechanical switching device controller.

In an example, system comprises an electromechanical switching device controller. Such controller comprises: a high-side (HS) transistor having a drain, a source and a gate, the drain coupled to a voltage supply node; a low-side (LS) transistor having a drain, a source and a gate, the source coupled to a ground node; a middle transistor having a drain, a source and a gate, the source coupled to the source of the HS transistor, and the drain coupled to the drain of the LS transistor, the coupling of the drain of the middle transistor and the drain of the LS transistor providing an output node of the system; a HS clamp coupled between the gate of the middle transistor and the output node; a LS clamp coupled between the gate of the LS transistor and the output node; and a driver coupled the gates of the HS transistor, the LS transistor and the middle transistor, the driver also coupled to the HS and LS clamps, the driver configured to time-modulate levels of voltages of the HS and LS clamps to switch a path through which current flows during turn-off of the electromechanical switching device controller, the path being one of a HS path and a LS path. In an example, the system further comprises a contactor coupled between the voltage supply and the output node.

In an example, a method, comprises: measuring a temperature of a low-side (LS) switch in a contactor controller, and measuring temperature of a high-side (HS) switch in the contactor controller; directing decay current, initially at a start of turn-off, through a LS path when the temperature of the LS switch is less than the temperature of the HS switch and through a HS path when the temperature of the HS path is less than the temperature of the LS path; and switching from the LS path, when used initially, to the HS path when the temperature of the LS switch increases greater than a first threshold amount to direct the decay current through the HS path, and switching from the HS path, when used initially, to the LS path when the temperature of the HS switch increases greater than a second threshold amount to direct the decay current through the LS path.

These and other features will be better understood from the following detailed description with reference to the accompanying drawings.

BRIEF DESCRIPTION OF THE DRAWINGS

Features of the disclosure may be understood from the following figures taken in conjunction with the detailed description.

DETAILED DESCRIPTION

Specific examples are described below in detail with reference to the accompanying figures. These examples are not intended to be limiting. In the drawings, corresponding numerals and symbols generally refer to corresponding parts unless otherwise indicated. The objects depicted in the drawings are not necessarily drawn to scale.

Figure 1:
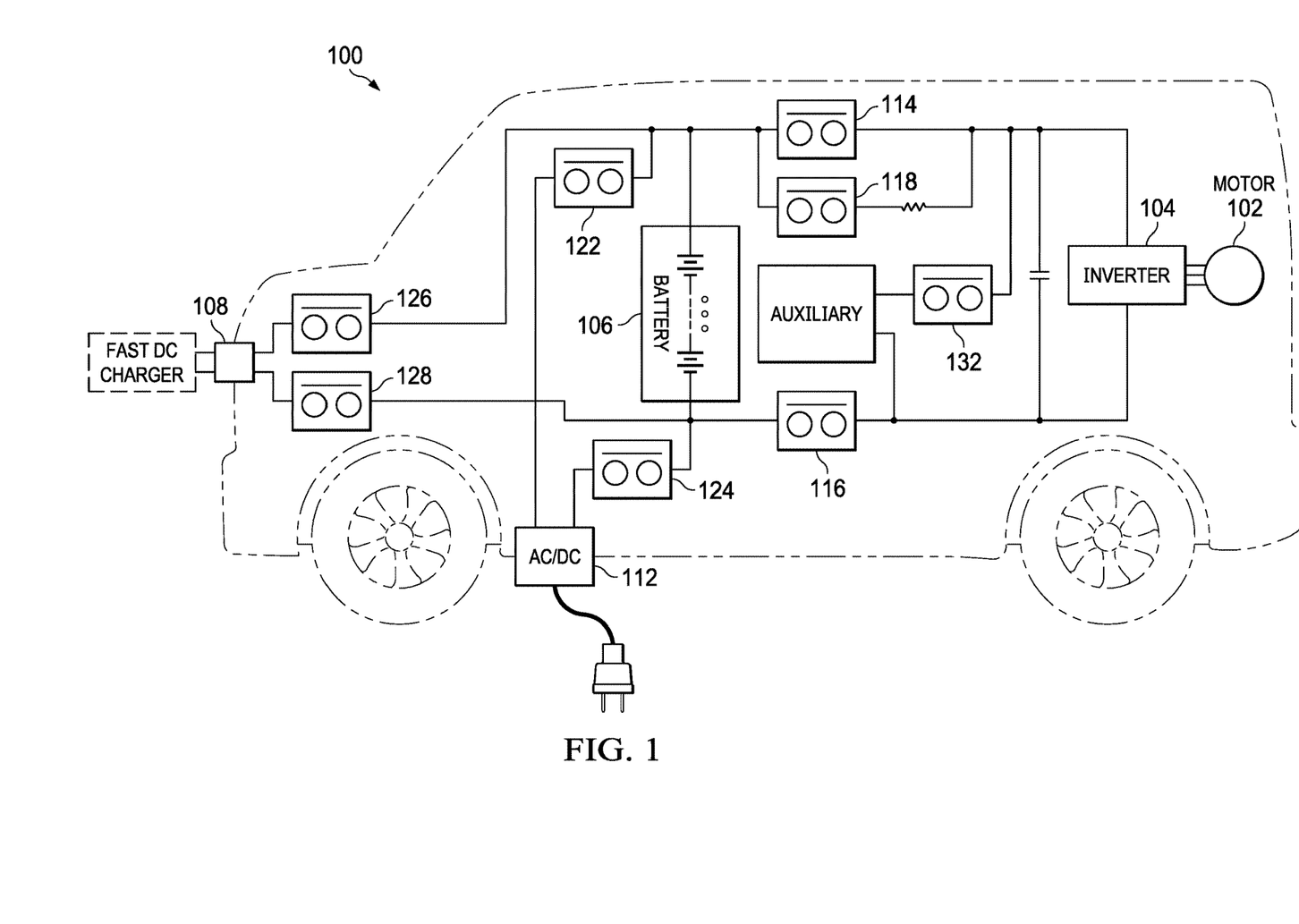
FIG. 1 is a diagram of various types of contactors that may be employed in an EV and/or an HEV.

FIG. 1 is a schematic diagram of a vehicle 100, which is an electric vehicle (EV) or hybrid electric vehicle (HEV), showing various types of contactors that may be used in such vehicle. The illustration is over inclusive in that not all of the contactors shown are necessarily used in either an EV or an HEV. The illustration is intended to give non-exhaustive examples of various contactors.

Vehicle 100 includes a motor 102 and traction inverter 104 coupled to motor 102. Vehicle 100 also includes a battery 106 and a fast DC charge port 108 that is adapted to receive DC charge from an external source. An HEV also includes an AC/DC onboard charger 112.

In the illustrated example, two main contactors 114 and 116 electrically isolate battery 106 and traction inverter 104 when vehicle 100 is switched off for safety. Main contactor 114 is a positive contactor that is disposed between the positive terminal of battery 106 and traction inverter 104. Main contactor 116 is a negative contactor that is disposed between the negative terminal of battery 106 and traction inverter 104. A pre-charge contactor 118 with series-coupled current-limiting resistance is coupled in parallel with main positive contactor 114. Pre-charge contactor 118 is used to charge an initially-discharged DC link capacitor before closing main contactors 114 and 116 to avoid a high inrush-current that may damage battery 106, one or both of main contactors 114 and 116, and/or the DC link capacitor.

When vehicle 100 is an HEV with plug-in charge capability, a pair of additional AC charge contactors 122 and 124 are included to establish connection between battery 106 and AC/DC onboard charger 112, which includes a plug to access an AC electrical source (e.g., an AC electrical outlet), converts that AC electricity to DC electricity to charge battery 106.

When vehicle 100 is an EV, a pair of DC fast charge contactors 126 and 128 to establish connection between fast DC charge port 108 and battery 106. An auxiliary contactor 132 is included for auxiliary components, e.g., the electric heating/cooling system.

Main contactors 114 and 116, pre-charge contactor 118, and DC charge contactors 126 and 128 are usually located in the battery junction box (or battery disconnect unit), while AC charger contactors 122 and 124 are likely to be placed in the battery power distribution unit, which is typically adjacent to AC/DC onboard charger 112.

When the controller for any of the above-identified contactors is turned-off, current in the load is discharged through a current decay path and as a result power is dissipated. In example arrangements, systems, circuits and methods are provided to perform quick-turn-off (QTO) more efficiently by cyclically performing QTO through multiple current paths, one of which is used at a time, in order to dissipate power in a larger area on the semiconductor chip on which the controlling circuitry is fabricated for increased overall performance of the chip. Clamp voltages are modulated and flipped to switch the decay path for the load current between an HS FET path and a LS FET path. In examples, both clamps remain active during the entire QTO process, providing redundancy and thus additional safety. The clamp voltage levels are controlled to control which current decay path is used, i.e., the HS FET path or the LS FET path. The output voltage is clamped at the lower of the two levels. In an example, the percentages the HS and LS FET paths are used in a given cycle (duty cycle modulation) is controlled based on change of the supply voltage. In an example, the switching between the HS and LS FET paths is based on local temperatures of the HS and LS FETs, respectively.

Figure 2:
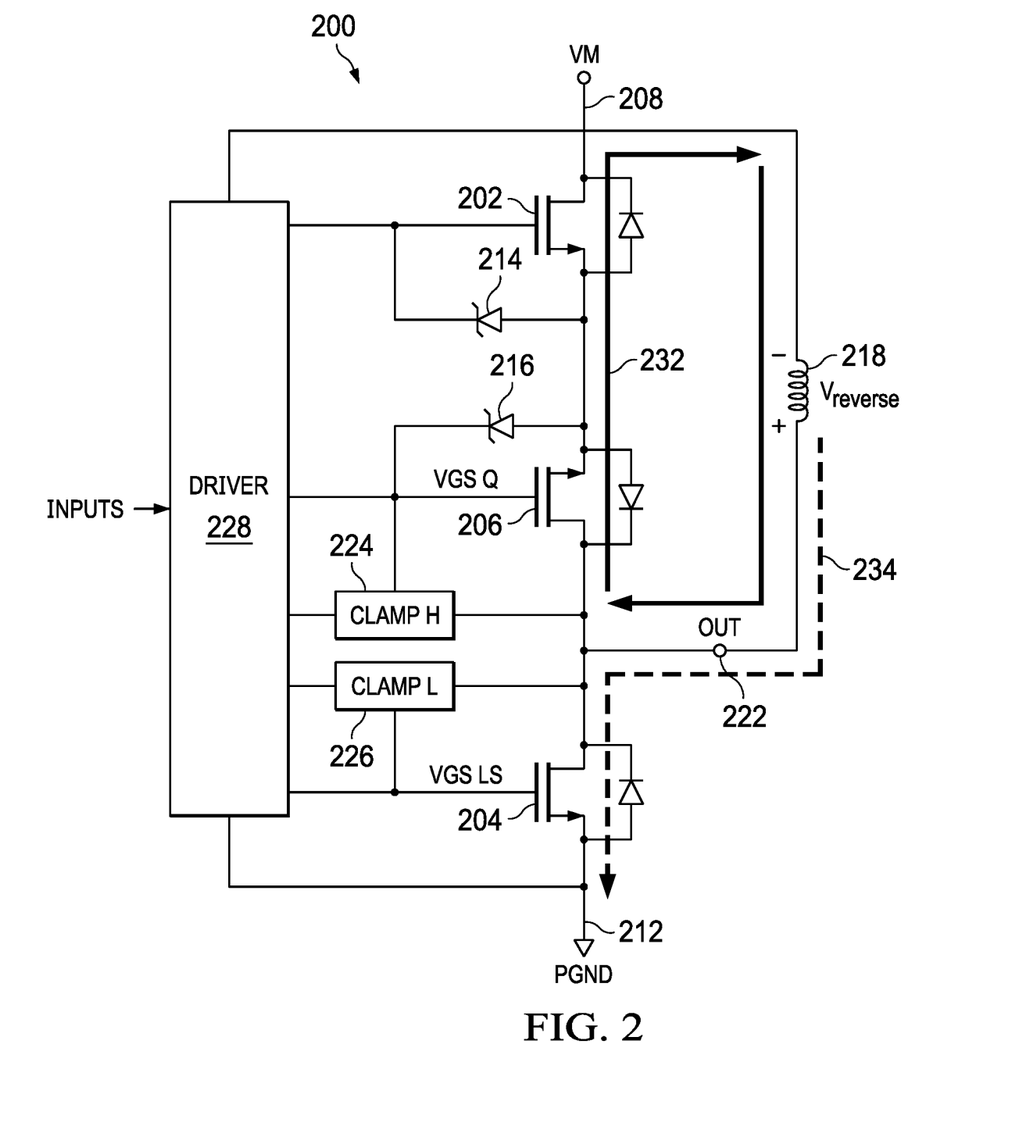
FIG. 2 is an example contactor system including a contactor controller showing high-side (HS) and low-side (LS) current flow paths during quick-turn-off (QTO).

FIG. 2 is a circuit and block diagram of an example contactor controller 200, e.g., electromechanical switching device controller, showing high-side (HS) and low-side (LS) current flow paths used during QTO. Contactor controller 200 may be a high-voltage contactor controller used with contactors in EVs and/or HEVs. Contactor controller 200 includes an HS switch 202, a LS switch 204, and a middle (Q) switch 206, each of which may be implemented as a field-effect transistor (FET), where the QFET is a quantum FET. The drain of HS FET 202 is coupled to a voltage supply node 208 that includes a terminal adapted to be coupled to a supply voltage (VM). The source of HS FET 202 is coupled to the source of QFET 206, the drain of which is coupled to the drain of LS FET 204. The source of LS FET 204 is coupled to ground 212, which may be a power ground (PGND). Each of FET 202, 204 and 206 includes a diode having an anode coupled to the source of the corresponding FET and a cathode coupled to the drain of that FET. A Zener diode 214 is coupled between the source and drain of HS FET 202, and a Zener diode 216 is coupled between the source and drain of QFET 206, as shown. A load 218, in the form of an inductor, is coupled between voltage supply node 208 and the common drain connection between LS FET 204 and QFET 206, which common connection forms an output node 222 (OUT). The reverse polarity voltage across load 218 is denoted $V_{reverse}$. Contactor controller 200 acts as a coil driving circuit in that contactor controller 200 drives inductor 218 to generate a magnetic force to mechanically operate an electric contact or armature (not shown).

Contactor controller 200 also includes HS and LS clamps 224 and 226, respectively. HS clamp (Clamp H) 224 is coupled between the gate and drain of QFET 206, and LS clamp (Clamp L) 226 is coupled between the gate and drain of LS FET 204. The gates of FETs 202, 204 and 206, as well as clamps 224 and 226, are controlled by a driver 228. Driver 228 may be a single integrated unit, as shown in FIG. 2, or it may be multiple drivers, one for each controlled component. Driver 228 is coupled to voltage supply node 208 and to ground 212 and is also configured to receive various inputs which are used to control FETs 202, 204 and 206, and clamps 224 and 226.

HS clamp 224 is configured to enable a path for the load current to charge the gate-to-source voltage (VGS) of QFET 206, while VGS of LS FET 204 remains low, causing load current to flow through a HS path 232 (VM path). LS clamp 226 is configured to enable a path for the load current to charge VGS of LS FET 204, causing the load current to flow through a LS path 234 (GND path) to ground 212. The clamp voltages may be controlled by driver 228, and through such control, the path through which the load current flows during QTO can be switched, thereby controlling QTO to achieve better overall thermal performance.

Figure 3:
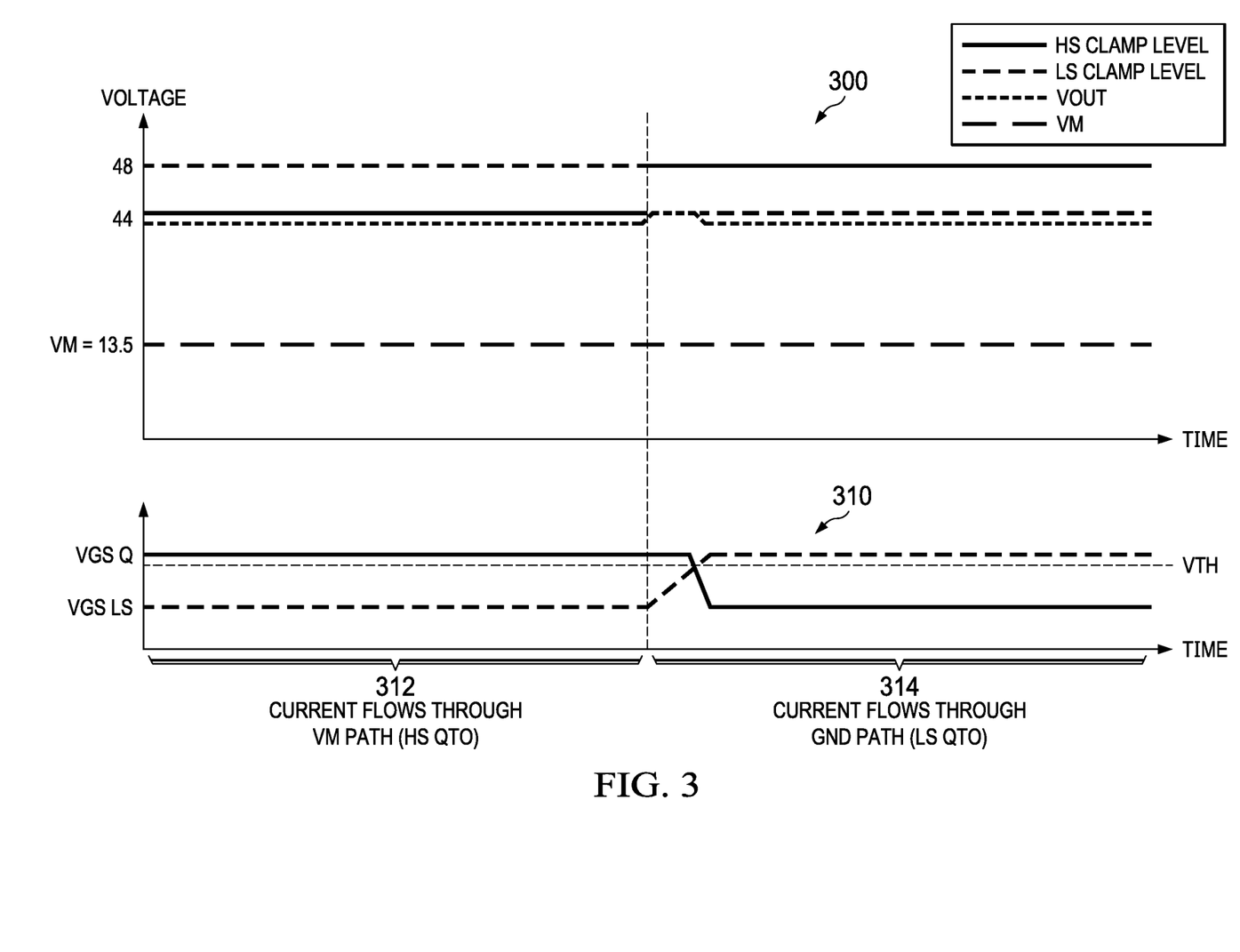
FIG. 3 are graphs of various voltages in the example contactor controller of FIG. 2 with respect to time and their relationship with when each of the HS and LS current paths is used during QTO.

FIG. 3 shows two voltage vs. time graphs 300 and 310. Graph 300 shows the voltage levels of clamps 224 and 226 (HS clamp level and LS clamp level, respectively), and graph 310 shows VGSs of LS FET 204 and QFET 206 (VGS LS and VGS Q, respectively). When the HS clamp level is lower than the LS clamp level, VGS LS is lower than VGS Q, with VGS LS being lower than a voltage threshold (VTH) and VGS Q being higher than VTH, load current flows through a HS path 232 (VM path) during time period 312 of QTO, which is HS QTO. When VGS LS is controlled to increase, the HS and LS clamp levels switch (LS clamp level lower than HS clamp level), at which time load current begins to flow through a LS path 234 (GND path) to ground 212 during time period 314 of QTO, which is LS QTO. As VGS LS is increasing, VGS Q starts to decrease, resulting in VGS LS and VGS Q switching levels relative to their levels when load current was flowing through HS path 232.

In the example of FIG. 3, the high clamp level is 48 V, and the low clamp level is 44 V. In other examples, the high and low clamp levels may be different. In the example of FIG. 3, the voltage (Vout) at voltage supply node 208 remains approximately at the low clamp level, experiencing a slight increase at the transition between switching load current flow from HS path 232 to LS path 234 before settling back to low clamp level. In the example of FIG. 3, the supply voltage (VM) remains at approximately 13.5 V. In another example, described below, VM does not remain at a constant level, and its change is used as an input to control the voltages of clamps 224 and 226.

Figure 4:
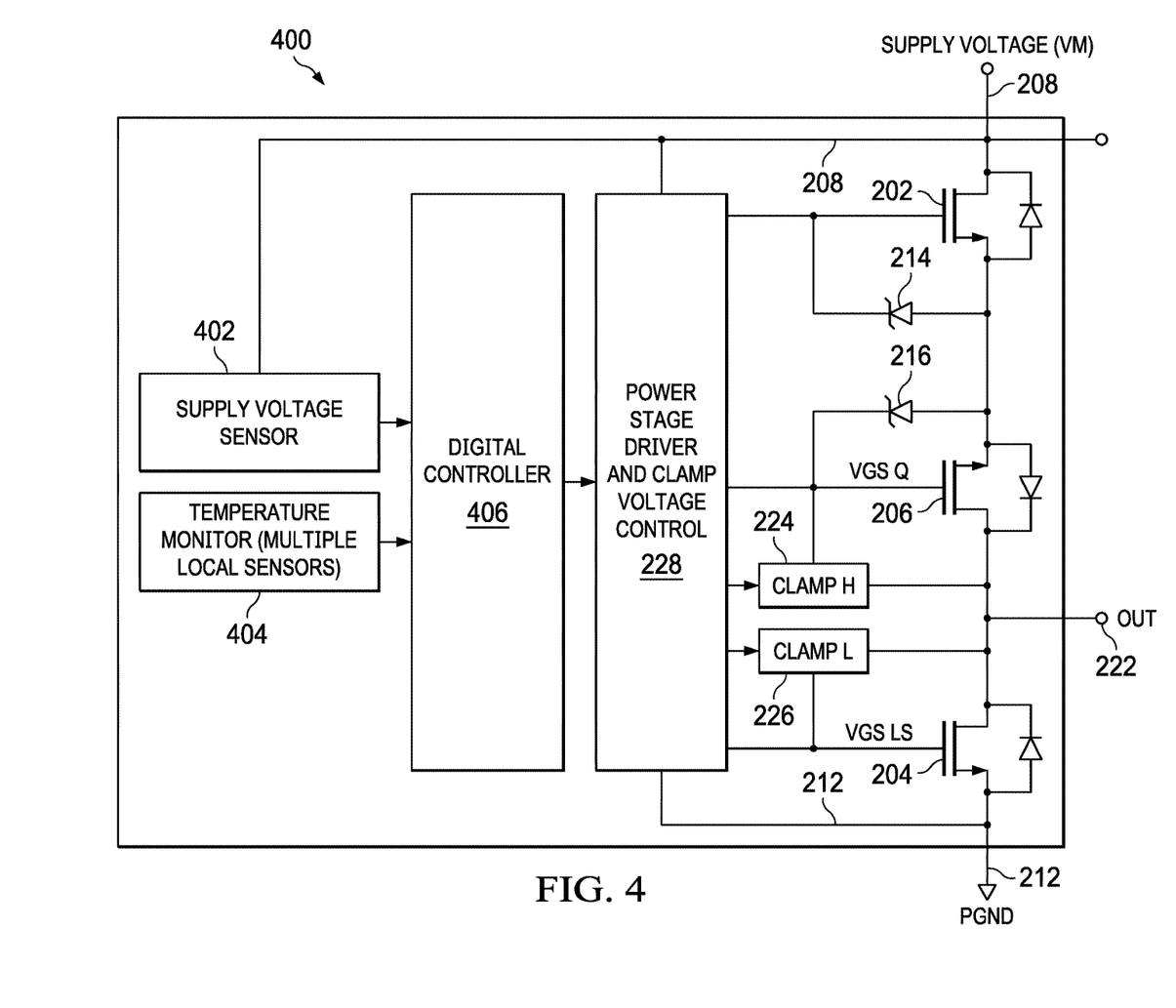
FIG. 4 is a block diagram of a system including a contactor controller that is configured to perform time-multiplexing of clamp voltages to control which current path is used at a given time.

FIG. 4 is a block diagram of a system 400 including a contactor controller that is configured to perform time-multiplexing of clamp voltages to control which current path (HS path 232 or LS path 234) is used at a given time. System 400 includes FETs 202, 204 and 206, Zener diodes 214 and 216, and clamps 224 and 226. Driver 228 is also included in system 400 and is denoted in FIG. 4 as a Power Stage Driver and Clamp Voltage Control component. System 400 may include a supply voltage sensor 402 that is coupled to voltage supply node 208 and configured to sense the supply voltage (VM), and/or a temperature monitor 404, which may be multiple local temperature sensors, each of which is configured to sense the temperature of a localized area and convert the sensed temperature to a corresponding electrical signal. Each of supply voltage sensor 402 and temperature monitor 404 includes an output coupled to a digital controller 406. The output from temperature monitor 404 may represent more than one output, e.g., there may be an output for each local temperature sensor.

Digital controller 406 is configured to control driver (Power Stage Driver and Clamp Voltage Control) 228 based on input from supply voltage sensor 402 and/or from temperature monitor 404. Driver 228, in turn, controls the voltages of clamps 224 and 226, as well as the gate voltages, to direct the flow of decay current during QTO to one or the other of HS path 232 and LS path 234.

Figure 5:
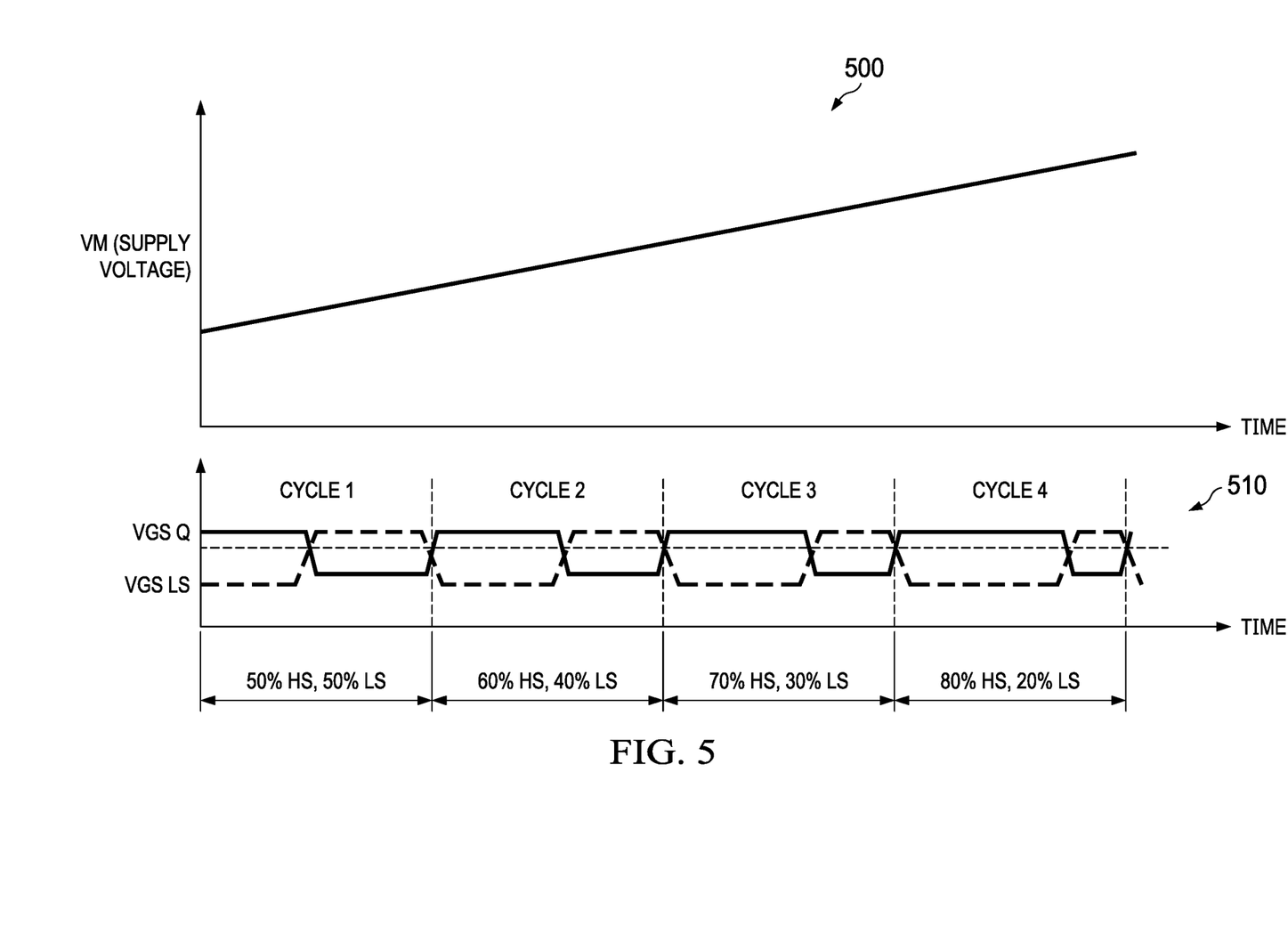
FIG. 5 shows example time or duty cycle modulation of use of the HS and LS current paths with respect to change of the supply voltage.

FIG. 5 shows example time or duty cycle modulation of use of HS path 232 and LS path 234 with respect to change of the supply voltage (VM). Graph 500 shows VM increasing over time. As VM increases, power dissipation in LS path 234 increases. Power=$(VM+V_{reverse})*I_{load}$, where hoax is the current flowing through load 218. Thus, in an example, the time of LS clamping is reduced as VM increases. Duty cycle modulation may also be made a function of VM and the area of each of HS FET 202 and LS FET 204, which may be approximately the same. That is, both the rate of increase of VM and the footprint of HS and LS FET 202, 204 on a semiconductor substrate. The sensitivity of the duty cycle modulation to VM increase may be adjusted based on the areas of HS and LS FETs 202 and 204.

Graph 510 shows the change in duty cycle as VM increases. In the first cycle (Cycle 1), each of HS path 232 and LS path 234 are used equally, that is, 50% of the time each. In succeeding cycles, the use of HS path 232 increases. In Cycle 2, HS path 232 is used 60% of the time. In Cycle 3, use of HS path 232 increases to 70%. In Cycle 4, HS path 232 is used 80% of the time. In other examples, the use of HS path 232 may be increased at different rates.

Figure 6:
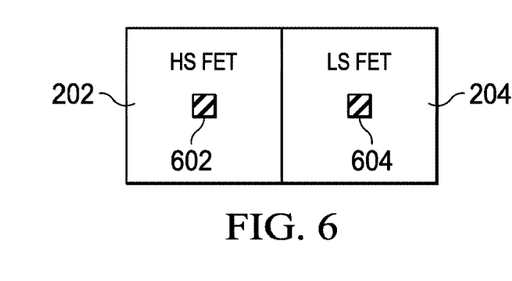
FIG. 6 is a schematic diagram of HS and LS temperature sensors for HS and low-side field-effect transistors (FETs) respectively.
Figure 7:
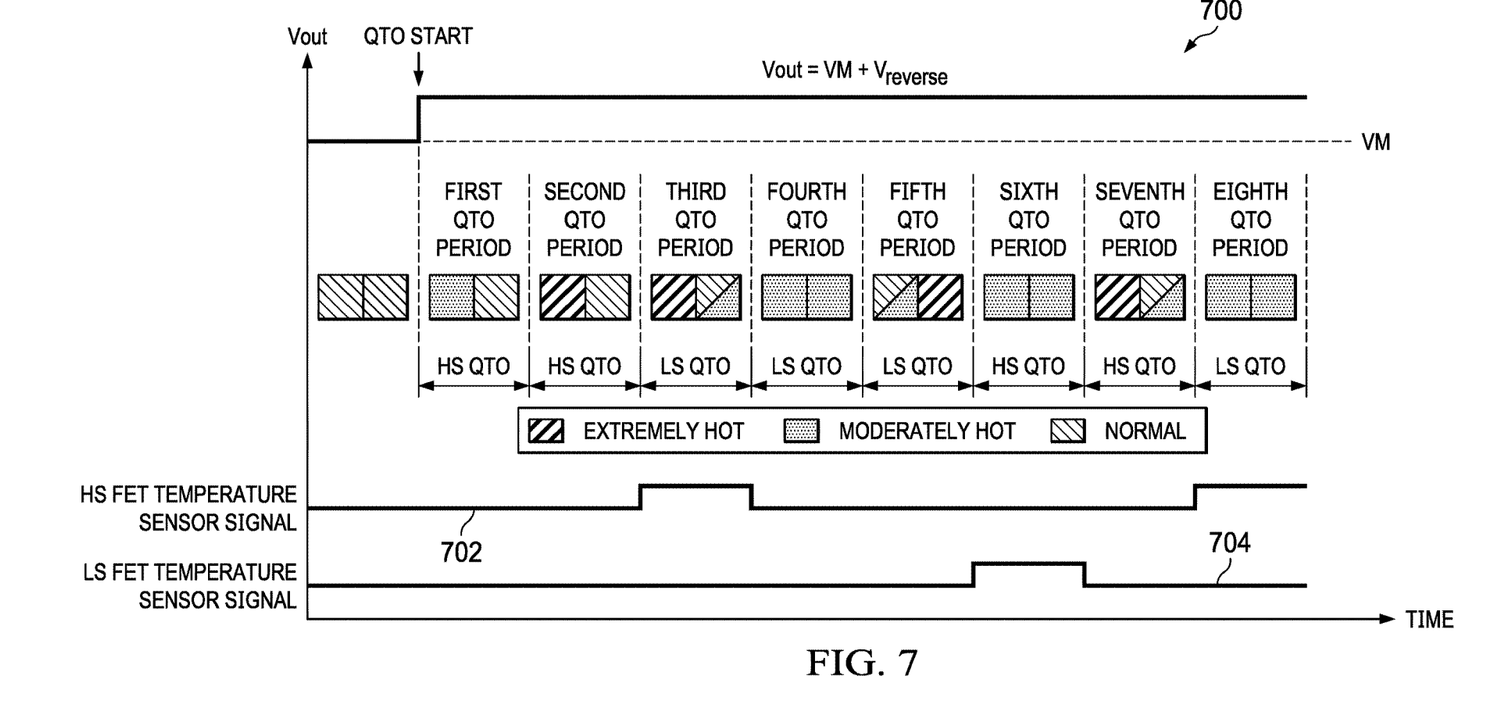
FIG. 7 shows example time modulation of use of the HS and LS current paths with respect to temperatures of the HS and LS FETs.

FIG. 6 is a schematic diagram of HS and LS temperature sensors 602 and 604 for HS FET 202 and LS FET 204, respectively. HS FET temperature sensor 602 may be place on or near HS FET 202, and LS FET temperature sensor 604 may be placed on or near LS FET 204. Temperature sensors 602 and 604 are disposed such that they are capable of sensing the temperatures of HS FET 202 and LS FET 204, respectively. Temperature sensors 602 and 604 may be part of temperature monitor 404. Each temperature sensor 602, 604 outputs an electrical signal indicative of its sensed temperature. Each electrical signal may be output to a digital controller, e.g., digital controller 406, FIG. 7 shows example time modulation of use of the HS and LS current paths with respect to temperatures of, or near, HS FET 202 and HS FET 204. These temperatures may be monitored and measured using temperature sensors 602 and 604. The output signals of sensors 602 and 604, denoted HS FET temperature sensor signal 702 and LS temperature sensor signal 704, respectively, are shown in FIG. 7. The temperature range of each FET 202, 204 is shown for a period of time prior to QTO, as well as for each of eight (8) successive periods of time of QTO. The first block of each pair represents the temperature range of LS FET 204, and the second block of each pair represents the temperature range of HS FET 202. There are three (3) temperature ranges in this example: extremely hot, moderately hot and normal.

In the example of FIG. 7, prior to QTO, the temperature of each of HS FET and LS FET is in a normal range, as indicated by the corresponding pair of blocks. Temperature sensor signals 702 and 704 are both logic low (e.g., "0"). QTO starts when Vout increases above VM by $V_{reverse}$, i.e., QTO starts at Vout+VM+$V_{reverse}$.

By the first QTO period, the temperature of LS FET 204 has increased to moderately hot, while the temperature of HS FET 202 remains in the normal range. Thus, during the first QTO period, the decay current is directed through HS path 232. The decay current continues to flow through HS path 232 for the second QTO period, as the temperature of LS FET 204 has increased further into the extremely hot range, while the temperature of HS FET 202 remains in the normal range. Then, while the temperature of LS FET 204 remains in the extremely hot range, the temperature of HS FET 202 begins to increase toward the moderately hot range. That temperature increase is enough to cause HS temperature sensor signal 702 to go to logic high (e.g., "1"), which in turn triggers a switch in decay paths. Thus, in the third QTO period, the decay current is directed through LS path 234. HS temperature sensor signal 702 returns to logic low at approximately the end of the third QTO period. Moving into the fourth QTO period, the temperature of HS FET 202 has risen to the moderately hot range, while the temperature of LS FET 204 has decreased to the moderately hot range. Thus, the decay current continues to be directed through LS path 234 in the fourth QTO period. The temperature of LS FET 204 continues to decrease toward the normal range, while the temperature of HS FET 202 increases to the extremely hot range. Thus, in the fifth QTO period, the decay current continues to be directed through LS path 234. The temperature of LS FET 204 then begins to increase toward the moderately hot range, which results in LS temperature sensor signal 704 going to logic high, which in turn triggers a switch to HS path 232, through which the decay current is directed to flow in the sixth QTO period. LS temperature sensor signal 704 returns to logic "0" at approximately the end of the sixth QTO period. The decay current continues to flow through HS path 232 in the seventh QTO period, as the temperature of LS FET 204 has increased further to the extremely hot range, while the temperature of HS FET 202 has decreased toward to the normal range. A path switch is triggered again back to LS path 234 for the eighth QTO period, resulting from a temperature increase of HS FET 202 back toward the extremely hot range and a corresponding change in HS temperature sensor signal 702 from logic low to logic high.

Thus, in the example of FIG. 7, during QTO, whenever one of HS FET 202 and LS FET 204 increase by a certain temperature threshold amount while the corresponding decay path is being used, digital controller 406 controls driver 228 to switch to the other current decay path, hence improving overall thermal performance and reliability.

Figure 8:
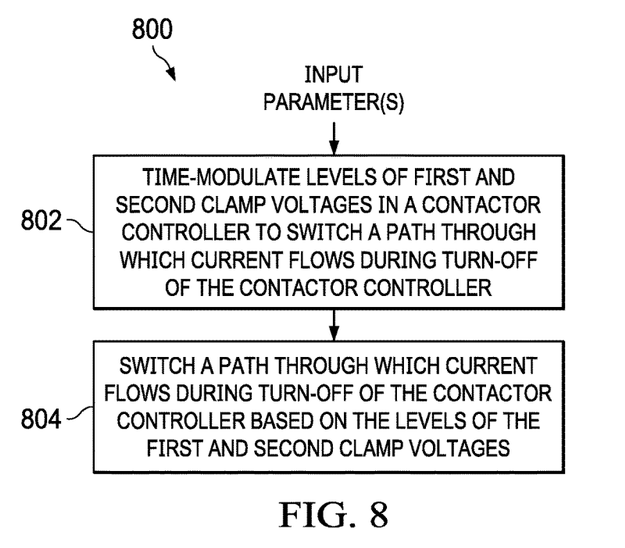
FIG. 8 is a flow diagram of an example method of operating a contactor controller, such as that shown in FIGS. 2 and/or 4.

FIG. 8 is a flow diagram of an example method 800 of operating a contactor controller or electromechanical switching device controller, e.g., contactor controller 200. In operation 802, the levels of first and second clamp voltages in contactor controller 200 are time-modulated to switch a path through which current flows during QTO of contactor controller 200. Such time-modulation may be based on any of various input parameters, such as the supply voltage VM and/or local temperatures, e.g., temperature of HS FET 202 and LS FET 204 of contactor controller 200. In operation 804, based on the levels of the first and second clamp voltages, the path through which current flows during QTO of the contactor controller is switched. In an example, there are two possible paths for current to flow during QTO: HS path 232 and LS path 234.

Figure 9:
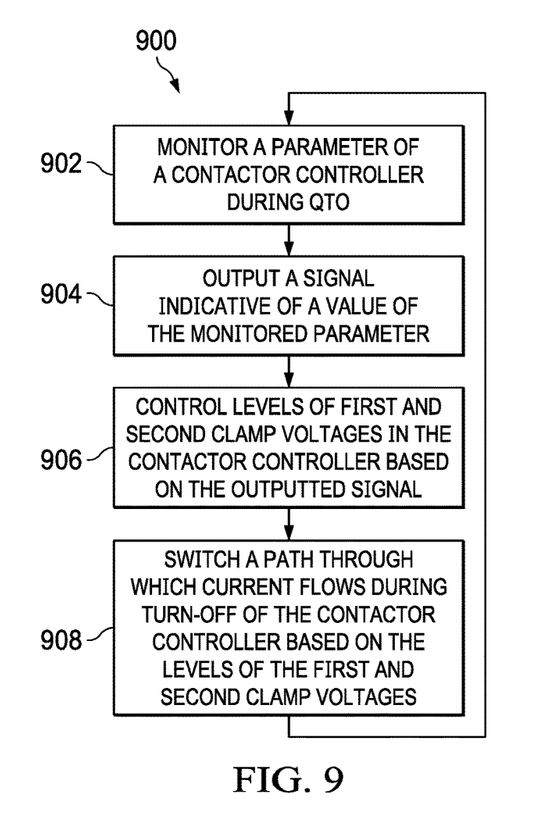
FIG. 9 is a flow diagram of an example method of operating a contactor controller, such as that shown in FIGS. 2 and/or 4.

FIG. 9 is a flow diagram of an example method 900 of operating a contactor controller or electromechanical switching device controller, e.g., contactor controller 200. In operation 902, a parameter of contactor controller 200 is monitored during QTO. The parameter may be supply voltage VM and/or local temperatures of HS and LS FETs 202, 204, respectively.

To carry out the monitoring, one or more sensors may be employed. For example, supply voltage sensor 402 may be configured as described with respect to FIG. 4. Alternatively, or in addition to supply voltage sensor 402, temperature monitor 404 that includes multiple local sensors may be configured as described in connection with FIG. 4. Each sensor may be configured to output an electrical signal indicative of the sensed parameter in operation 904, which signal may be used control levels of first and second clamp voltages in operation 906. For example, in a configuration in which supply voltage sensor 402 is used, as the supply voltage VM increases, supply voltage sensor 402 outputs a higher magnitude signal indicative of the increase. Based on this signal, the levels of the voltages of HS clamp 224 and LS clamp 226 may be controlled to control HS path/LS path duty cycle, as shown and described with respect to FIG. 5. In a configuration in which temperature monitor 404 including HS FET and LS FET temperature sensors 602 and 604 are used, control the clamp voltage levels and hence the switching of decay current paths may be carried out as described in connection with FIG. 7. Thus, in operation 908, the path through which current flows during QTO of contactor controller 200 based on the levels of HS and LS clamps 224, 226.

Example method 900 may be repeated throughout the QTO process, switching back and forth between HS path 232 and LS path 234, based on the monitored parameter.

Each of FIGS. 8 and 9 depicts one possible set and order of operations. Not all operations need necessarily be performed in the order described. Some operations may be combined into a single operation. Additional operations and/or alternative operations may be performed.

The example systems, circuits and methods improve QTO in electromechanical switching device controllers, e.g., high-voltage contactor controllers. Device thermal performance is improved by modulating decay current flow between an HS path and a LS path. The modulation may be controlled based on any of various parameters, including supply voltage level and/or relative temperatures of the HS and LS switching transistors. Both the HS clamp and the LS clamp remain active, thereby providing redundancy and safety. Electromechanical switching device controllers configured as disclosed herein can support high load currents, thus improving the operation range of such devices.

The term "couple" is used throughout the specification. The term and derivatives thereof may cover connections, communications, or signal paths that enable a functional relationship consistent with this description. For example, if device A provides a signal to control device B to perform an action, in a first example device A is coupled to device B, or in a second example device A is coupled to device B through intervening component C if intervening component C does not substantially alter the functional relationship between device A and device B such that device B is controlled by device A via the control signal provided by device A.

A device that is "configured to" perform a task or function may be configured (i.e. programmed and/or hardwired) at a time of manufacturing by a manufacturer to perform the function and/or may be configurable (or re-configurable) by a user after manufacturing to perform the function and/or other additional or alternative functions. The configuring may be through firmware and/or software programming of the device, through a construction and/or layout of hardware components and interconnections of the device, or a combination thereof.

As used herein, the terms "terminal" and "node" generally mean an interconnection between or a terminus of a device element, a circuit element, an integrated circuit, a device or other electronic or semiconductor component.

A circuit or device that is described herein as including certain components may instead be adapted to be coupled to those components to form the described circuitry or device. For example, a structure described as including one or more semiconductor elements (such as transistors), one or more passive elements (such as resistors, etc.), and/or one or more sources (such as voltage and/or current sources) may instead include only the semiconductor elements within a single physical device (i.e. a semiconductor die and/or integrated circuit (IC) package) and may be adapted to be coupled to at least some of the passive elements and/or the sources to form the described structure either at a time of manufacture or after a time of manufacture, for example, by an end-user and/or a third-party.

While the use of FETs is described herein, other types of transistors (or equivalent devices) may be used instead. For example, instead of using FETs, bipolar junction transistors (BJTs) may be used instead of, or in addition to, FETs in the various circuits described. Other suitable switching devices consistent with the teachings herein may also be used. Circuits described herein are reconfigurable to include the replaced components to provide functionality at least partially similar to functionality available prior to the component replacement.

Uses of the phrase "ground" in the foregoing description refers primarily to a power ground, but includes a chassis ground, an Earth ground, a floating ground, a virtual ground, a digital ground, a common ground, and/or any other form of ground connection applicable to, or suitable for, the teachings of this description. Unless otherwise stated, "about," "approximately," or "substantially" preceding a value means+/−10 percent of the stated value.

Modifications of the described examples are possible, as are other examples, within the scope of the claims. Moreover, features described herein may be applied in other environments and applications consistent with the teachings provided.

What is claimed is:

1. A method, comprising:
   time-modulating levels of first and second clamp voltages in an electromechanical switching device controller to switch a path through which current flows during turn-off of the electromechanical switching device controller;
   wherein the path switching is a function of at least one of a level of a supply voltage of the electromechanical switching device controller, and temperatures of a high-side (HS) transistor and a low-side (LS) transistor of the electromechanical switching device controller.

2. The method of claim 1, wherein the time-modulating includes controlling the first clamp voltage to be a first level and the second clamp voltage to be a second level that is greater than the first level during a first time period.

3. The method of claim 2, wherein the current flows through a first path including a node of the supply voltage when the first clamp voltage is at the first level and the second clamp voltage is at the second level.

4. The method of claim 3, wherein the time-modulating includes controlling the first clamp voltage to be the second level and the second clamp voltage to be the first level during a second time period that is different than the first time period.

5. The method of claim 4, wherein the current flows through a second path including a ground node when the first clamp voltage is at the second level and the second clamp voltage is at the first level.

6. The method of claim 5, wherein the first path is a HS path through the HS transistor of the electromechanical switching device controller and the second path is a LS path through the LS transistor of the electromechanical switching device controller.

7. The method of claim 6, wherein the controlling of the first and second clamp voltage levels includes controlling, by a LS clamp, gate-to-source voltage of the LS transistor.

8. The method of claim 7, wherein, when the gate-to-source voltage of the LS transistor is controlled to be at a first level that is below a gate-to-source voltage of a transistor coupled between the HS transistor and the LS transistor, the current flows through the HS path.

9. The method of claim 8, wherein, when the gate-to-source voltage of the LS transistor is controlled to increase from the first level, the path through which the current flows is switched from the HS path to the LS path.

10. A system, comprising:
    an electromechanical switching device controller comprising:
    a high-side (HS) transistor having a drain, a source and a gate, the drain coupled to a voltage supply node;
    a low-side (LS) transistor having a drain, a source and a gate, the source coupled to a ground node;
    a middle transistor having a drain, a source and a gate, the source coupled to the source of the HS transistor, and the drain coupled to the drain of the LS transistor, the coupling of the drain of the middle transistor and the drain of the LS transistor providing an output node of the system;
    a HS clamp coupled between the gate of the middle transistor and the output node;
    a LS clamp coupled between the gate of the LS transistor and the output node; and
    a driver coupled the gates of the HS transistor, the LS transistor and the middle transistor, the driver also coupled to the HS and LS clamps, the driver configured to time-modulate levels of voltages of the HS and LS clamps to switch a path through which current flows during turn-off of the electromechanical switching device controller, the path being one of a HS path and a LS path.

11. The system of claim 10, further comprising:
    a voltage sensor coupled to the supply voltage node and configured to output a signal indicative of a voltage at the supply voltage node; and
    a controller coupled to the voltage sensor to receive the output signal of the voltage sensor, the controller also coupled to the driver;
    wherein the path switching is controlled by the output signal of the voltage sensor.

12. The system of claim 10, further comprising:
    a HS temperature sensor configured to sense the temperature of the HS transistor and output a HS temperature signal indicative of the temperature of the HS transistor;
    a LS temperature sensor configured to sense the temperature of the LS transistor and output a LS temperature signal indicative of the temperature of the LS transistor; and
    a controller coupled to the HS and LS temperature sensors to receive the output signal, the controller also coupled to the driver;

wherein the path switching is controlled by the HS and LS temperature signals.

13. The system of claim 11, wherein a percentage of time the current flows through the LS path is reduced as the voltage at the voltage supply node increases.

14. The system of claim 12, wherein, whenever the HS temperature signal increases above a threshold while current is flowing through the HS path, the controller switches current flow to the LS path.

15. The system of claim 12, wherein, whenever the LS temperature signal increases above a threshold while current is flowing through the LS path, the controller switches current flow to the HS path.

16. The system of claim 12, wherein:
   whenever the HS temperature signal increases above a first threshold while current is flowing through the HS path and the LS temperature signal is below a second threshold, the controller switches current flow to the LS path; and
   whenever the LS temperature signal increases above the second threshold while current is flowing through the LS path and the HS temperature signal is below the first threshold, the controller switches current flow to the HS path.

17. The system of claim 10, wherein the electromechanical switching device controller is a high-voltage contactor controller.

18. The system of claim 10, further comprising a contactor coupled to the high-voltage contact controller.

19. A method, comprising:
   measuring a temperature of a low-side (LS) switch in a contactor controller, and measuring temperature of a high-side (HS) switch in the contactor controller;
   directing decay current, initially at a start of turn-off, through a LS path when the temperature of the LS switch is less than the temperature of the HS switch and through a HS path when the temperature of the HS path is less than the temperature of the LS path; and
   switching from the LS path, when used initially, to the HS path when the temperature of the LS switch increases greater than a first threshold amount to direct the decay current through the HS path, and switching from the HS path, when used initially, to the LS path when the temperature of the HS switch increases greater than a second threshold amount to direct the decay current through the LS path.

20. The method of claim 19, further comprising:
   outputting a LS switch temperature signal at a set logic level whenever the temperature of the LS switch increases greater than the first threshold amount; and
   outputting a HS switch temperature signal at the set logic level whenever the temperature of the HS switch increases greater than the second threshold amount.

21. The method of claim 20, wherein the switching from the LS path to the HS path is responsive to the outputting of the LS switch temperature signal at the set logic level, and the switching from the HS path to the LS path is responsive to the outputting of the HS switch temperature signal at the set logic level.

\* \* \* \* \*